(12) United States Patent
Kondo et al.

(10) Patent No.: US 8,501,879 B2
(45) Date of Patent: Aug. 6, 2013

(54) ADHESIVE COMPOSITION, ADHESIVE SHEET, SEMICONDUCTOR APPARATUS PROTECTION MATERIAL, AND SEMICONDUCTOR APPARATUS

(75) Inventors: Kazunori Kondo, Annaka (JP); Michihiro Sugo, Annaka (JP); Hideto Kato, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 99 days.

(21) Appl. No.: 13/221,547

(22) Filed: Aug. 30, 2011

(65) Prior Publication Data

US 2012/0108762 A1   May 3, 2012

(30) Foreign Application Priority Data

Oct. 28, 2010   (JP) ................. 2010-242524

(51) Int. Cl.
  *C08G 83/00*  (2006.01)
  *C08G 77/20*  (2006.01)
  *C08L 83/14*  (2006.01)
  *C08F 299/08*  (2006.01)

(52) U.S. Cl.
  USPC ............................ 525/476; 525/474; 528/32

(58) Field of Classification Search
  USPC ................................ 525/476, 474
  See application file for complete search history.

(56) References Cited

U.S. PATENT DOCUMENTS

| 3,159,601 | A | 12/1964 | Ashby |
| 3,159,662 | A | 12/1964 | Ashby |
| 3,220,972 | A | 11/1965 | Lamoreaux |
| 3,775,452 | A | 11/1973 | Karstedt |
| 2008/0182087 | A1 | 7/2008 | Kato et al. |

FOREIGN PATENT DOCUMENTS

| EP | 1 484 353 A1 | 12/2004 |
| EP | 2 242 090 A1 | 10/2010 |
| JP | A-2003-48989 | 2/2003 |
| JP | A-2007-217708 | 8/2007 |
| JP | A-2008-184571 | 8/2008 |
| JP | A-2009-239138 | 10/2009 |

OTHER PUBLICATIONS

Dec. 2, 2011 European Search Report issued in European Patent Application No. EP 11 00 8017.3.
Mar. 19, 2013 Notification of Reasons for Refusal issued in Japanese Application No. 2010-242524 with partial English-language translation.

*Primary Examiner* — Randy Gulakowski
*Assistant Examiner* — Christopher M Rodd
(74) *Attorney, Agent, or Firm* — Oliff & Berridge, PLC (57) ABSTRACT

A semiconductor apparatus adhesive composition having excellent adhesion properties when pressure-bonded and has excellent connection reliability and insulation reliability when hardened and an adhesive sheet using this adhesive composition. An adhesive composition including: (A) a silicone resin constituted of a repeating unit represented by the following general formula (1); (B) a thermosetting resin; and (C) a compound having a flux activity,

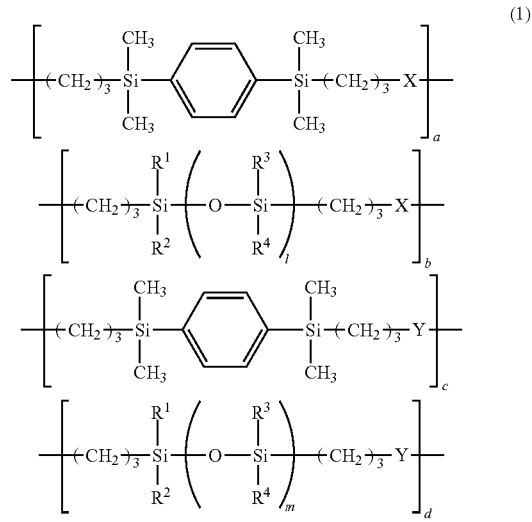

where $R^1$ to $R^4$ represent univalent hydrocarbon groups having carbon numbers from 1 to 8, which are equal to or different from each other; each of l and m is an integer from 1 to 100; each of a, b, c, and d is 0 or a positive number and meets $0<(c+d)/(a+b+c+d)\leq 1.0$; and each of X and Y is a bivalent organic group.

16 Claims, 3 Drawing Sheets

ADHESIVE COMPOSITION, ADHESIVE SHEET, SEMICONDUCTOR APPARATUS PROTECTION MATERIAL, AND SEMICONDUCTOR APPARATUS

BACKGROUND OF THE INVENTION

1. Field of the Invention

The present invention relates to an adhesive composition and an adhesive sheet, and more particularly to an adhesive composition and an adhesive sheet suitable for a use application of protecting a semiconductor.

2. Description of the Related Art

In recent years, with miniaturization and realization of high performance of electronic devices, a demand for density growth and high integration of semiconductor apparatuses is intensified, and realization of a high capacity and density growth of IC packages are advancing. To connect a semiconductor chip with a substrate, a wire bonding method using a thin metallic wire has been conventionally widely applied, but a flip chip mounting method for forming a conductive protrusion called a bump on a semiconductor chip and directly connecting a substrate electrode with the bump on the semiconductor chip is becoming mainstream in order to cope with the demand for density growth and high integration. In general, in the flip chip mounting method, for the purpose of reinforcement of a connecting portion, improvement of reliability, and others, a gap between the semiconductor chip and the circuit substrate is sealed with a resin. As a resin sealing method, there is generally a capillary underfill method, and this method is carried out by applying a liquid sealing resin composition to one side or a plurality of sides of the chip and utilizing a capillary phenomenon to flow the resin composition into the gap between the circuit substrate and the chip (see Japanese Patent Laid-open (kokai) No. 2007-217708).

Figure 1:
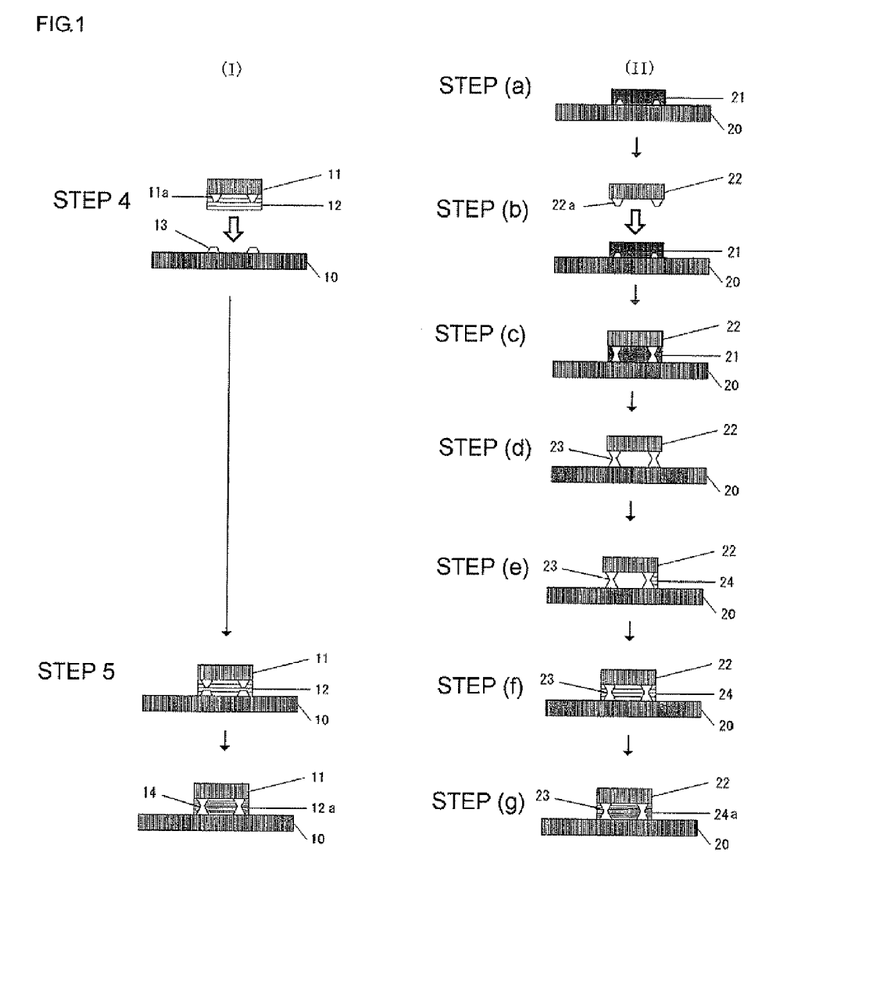
FIG. 1 is a flow diagram comparing (I) flip chip mounting steps using an adhesive sheet having an adhesive layer made of an adhesive composition according to the present invention with (II) flip chip mounting steps of a capillary underfill method.

As shown in FIG. 1(II), such a capillary underfill method requires a step of, e.g., applying a flux 21 to a circuit substrate 20 (a step (a)), a step of mounting a semiconductor chip 22 having bumps 22a formed thereon onto the circuit substrate 20 (a step (b)), a joining step of joining and connecting the semiconductor chip 22 to the circuit substrate 20 by using the flux 21 to form joint portions 23 for the semiconductor chip and the substrate (a step (c)), a flux cleaning step (a step (d)), a step of applying a liquid sealing resin composition (underfill 24) to one side or a plurality of sides of the semiconductor chip 22 (a step (e)), a step of flowing the liquid sealing resin composition (the underfill 24) into a gap between the circuit substrate 20 and the semiconductor chip 22 by utilizing the capillary phenomenon (a step (f)), and a sealing step of hardening the liquid sealing resin composition (the underfill 24) used for filling to provide hardened underfill 24a and sealing step for performing resin sealing (a step (g)) is required, and hence this method is complicated, and the cleaning liquid waste disposal is required. Further, since the capillary phenomenon is used for the resin sealing at the step (f), a sealing time is increased, and a problem may occur in productivity.

Consequently, as a method for solving these problems, there is disclosed as method for directly attaching a semiconductor adhesive film made of an acrylic resin composition containing a compound having a flux activity to a semiconductor chip and using the chip in this state (see Japanese Patent Laid-open (kokai) No. 2009-239138). In this process, the flux is not used, the semiconductor adhesive film is bonded to a functional surface of the semiconductor chip, the semiconductor chip is joined and connected to the circuit substrate (a joining step), and the semiconductor adhesive film functions as not only the flux but also a resin sealant after the joining step. Therefore, in the capillary underfill method shown in FIG. 1(II), the step of, e.g., applying the flux 21 to the circuit substrate 20, the flux cleaning step (the step (d)), the step of applying the liquid sealing resin composition (the underfill 24) to one side or a plurality of sides of the semiconductor chip 22 (the step (e)), and the step of flowing the liquid sealing resin composition (the underfill 24) into the gap between the circuit substrate 20 and the semiconductor chip 22 by utilizing the capillary phenomenon are no longer required. As a result, the complication of the steps in the capillary underfill method can be improved. However, productivity can be improved as compared with the conventional capillary underfill method, but an acrylic resin, which is especially an acrylic resin containing acrylic nitrile, is used in Japanese Patent Laid-open (kokai) No. 2009-239138, and hence there is a serious problem that insulation reliability (migration resisting properties) under high-temperature and humidity conditions is poor. Therefore, in the method disclosed in Japanese Patent Laid-open (kokai) No. 2009-239138, the purpose of, e.g., reinforcement of the connecting portion in flip-chip mounting or improvement of reliability is not perfectly achieved. Therefore, development of an adhesive composition for a semiconductor apparatus that exhibits excellent adhesion properties when pressure-bonded and has excellent connection reliability and insulation reliability when hardened has been strongly demanded.

SUMMARY OF THE INVENTION

To solve the above-described problem, it is an object of the present invention to provide a semiconductor apparatus adhesive composition that has excellent adhesion properties when pressure-bonded and also has excellent connection reliability and insulation reliability when hardened and also provide an adhesive sheet that uses the adhesive composition and also functions as a resin sealant.

To achieve the object, according to the present invention, there is provided an adhesive composition comprising at least:

(A) a silicone resin constituted of a repeating unit represented by the following general formula (1);
(B) a thermosetting resin; and
(C) a compound having a flux activity, wherein $R^1$ to $R^4$ represent univalent hydrocarbon groups having carbon numbers from 1 to 8, which are equal to or different from each other; each of l and m is an integer from 1 to 100; each of a, b, c, and d is 0 or a positive number and meets $0<(c+d)/(a+b+c+d)\leqq1.0$; and each of X and Y is a bivalent organic group represented by the following general formula (2) or (3), (2)

wherein Z is a bivalent organic group selected from the following formulae;

n is 0 or 1; $R^5$ and $R^6$ represent an alkyl group or an alkoxy group having a carbon number from 1 to 4 and they are different from each other or equal to each other; and k is 0, 1, or 2, (3)

wherein V is a bivalent organic group selected from the following formulae;

p is 0 or 1; $R^7$ and $R^8$ represent an alkyl group or an alkoxy group having a carbon number from 1 to 4 and they are different from each other or equal to each other; and h is 0, 1, or 2.

As described above, the adhesive composition comprising at least (A) the silicone resin constituted of a repeating unit represented by general formula (1), (B) the thermosetting resin, and (C) the compound having a flux activity can be a semiconductor apparatus adhesive composition that has excellent adhesion properties and also has excellent connection reliability and insulation reliability when hardened. In regard to each of these compositional components, (A) the silicone resin gives the adhesive composition according to the present invention adhesion properties, film forming properties, mechanical characteristics, and others and provides the adhesive composition also having good insulation reliability, (B) the thermosetting resin gives the adhesive composition according to the present invention adhesion properties, connection reliability, and insulation reliability, and (C) the compound having a flux activity has an effect of removing a metal oxide film by heating and the like (the flux activity) and gives the adhesive composition according to the present invention the flux activity.

Further, it is preferable for (B) the thermosetting resin to be made of an epoxy resin or made of an epoxy resin and an epoxy resin hardener.

As described above, when (B) the thermosetting resin is made of the epoxy resin or of the epoxy resin and the epoxy resin hardener, there can be obtained the (B) the thermosetting resin that shows a cross-linking reaction with an epoxy group contained in (A) the silicone resin when the adhesive composition is hardened, which is preferable since adhesion properties when pressure-bonded, connection reliability and insulation reliability when, e.g., hardened can be further improved and hardening can be appropriately and uniformly advanced by using the epoxy resin hardener together.

Furthermore, it is preferable for (C) the compound having a flux activity to be a compound having a carboxy group or a phenolic hydroxy group.

As described above, if (C) the compound having the flux activity is the compound having the carboxy group or the phenolic hydroxy group, it is possible to obtain a high effect of removing a metal oxide film of each bump soldered on a functional surface by, e.g., heat of soldering when performing soldering and the like with respect to the functional surface of a semiconductor chip bonded to the adhesive compound, which is preferable.

Moreover, there is provided an adhesive sheet comprising an adhesive layer constituted of the adhesive composition.

As described above, when the adhesive sheet comprising the adhesive layer made of the adhesive composition is provided, a step of, e.g., applying a flux to a circuit substrate, a flux cleaning step, a step of applying a liquid sealing resin composition to one side or a plurality of sides of a semiconductor chip, and a step of flowing a resin composition into a gap between a circuit substrate and the chip by utilizing a capillary phenomenon are no longer required at the time of flip-chip-mounting the semiconductor chip on the substrate, and there can be provided the adhesive sheet that functions as the flux when bonding the semiconductor chip to the circuit substrate, also functions as a resin sealant when the adhesive layer is hardened, has excellent adhesion properties when pressure-bonded and also has excellent connection reliability and insulation reliability when hardened.

Additionally, there is provided a semiconductor apparatus protection material comprising the adhesive sheet.

As described above, when the semiconductor apparatus protection material comprising the adhesive sheet is provided, there can be obtained a semiconductor apparatus protection material that has excellent adhesion properties, has excellent connection reliability and insulation reliability, and also functions as a resin sealant when the adhesive layer is hardened.

Further, there is provided a semiconductor apparatus protected by the semiconductor apparatus protection material.

As described above, when the semiconductor apparatus protected by the semiconductor apparatus protection material is provided, there can be obtained a semiconductor apparatus that is securely bonded and protected by the semiconductor protection material and has guaranteed connection reliability and insulation reliability.

As described above, according to the present invention, the step of, e.g., applying the flux to the circuit substrate, the flux cleaning step, the step of applying the liquid sealing resin composition to one side or a plurality of sides of the semiconductor chip, and the step of flowing the resin composition into the gap between the circuit substrate and the chip by utilizing the capillary phenomenon are no longer required, the semiconductor apparatus adhesive composition that has excellent adhesion properties when pressure-bonded and also has excellent connection reliability and insulation reliability when hardened can be provided, and the adhesive sheet having the adhesive composition as the adhesion layer can be also provided. Furthermore, according to the present invention, the semiconductor apparatus protection material using the adhesive composition and the semiconductor apparatus protected by these members can be provided.

DETAILED DESCRIPTION OF THE PREFERRED EMBODIMENTS

An adhesive composition, an adhesive sheet, a semiconductor apparatus protection material, and a semiconductor apparatus according to the present invention will now be descried hereinafter in detail, but the present invention is not restricted thereto.

As described above, development of a semiconductor apparatus adhesive composition having excellent adhesion properties when pressure-bonded and also has excellent connection reliability and insulation reliability when hardened has been demanded.

As a result of repeatedly conducting keen examination to achieve the objects, the present inventors discovered that a composition, which contains (C) a compound having a flux activity, (A) a silicone resin as a main component, and (B) a thermosetting resin meet characteristics required for the semiconductor apparatus adhesive composition, thereby bringing the present invention to completion. Furthermore, the present inventors also revealed that, when an adhesive sheet having an adhesive layer made of the adhesive composition according to the present invention is provided, a step of, e.g., applying a flux to a circuit substrate, a flux cleaning step, a step of applying a liquid sealing resin composition to one side or a plurality of sides of a semiconductor chip, and a step of flowing a resin composition into a gap between the circuit substrate and the chip by utilizing the capillary phenomenon are no longer required when flip-chip-mounting the semiconductor chip on the substrate, and this adhesive sheet can be an adhesive sheet that functions as the flux when joining and connecting the semiconductor chip to the circuit substrate, also functions as a resin sealant when the adhesive layer is hardened, and has excellent adhesion properties when pressure-bonded and also has excellent connection reliability and insulation reliability when hardened. Moreover, the present inventors found out that a semiconductor apparatus protection material including the adhesive sheet according to the present invention can be a semiconductor apparatus protection material that has excellent adhesion properties when pressure-bonded and excellent connection reliability and insulation reliability when hardened and also functions as a resin sealant and that a semiconductor apparatus protected by the semiconductor apparatus protection material according to the present invention can be a semiconductor apparatus that is strongly bonded and protected by the semiconductor apparatus protection material and has guaranteed connection reliability and insulation reliability, thereby bringing the present invention to completion.

[Adhesive Composition]

The present invention provides an adhesive composition comprising at least:

(A) a silicone resin constituted of a repeating unit represented by the following Generation Expression (1);

(B) a thermosetting resin; and (C) a compound having a flux activity. Each compositional component will now be described hereinafter in detail, wherein $R^1$ to $R^4$ represent univalent hydrocarbon radicals having carbon numbers from 1 to 8, which may be equal to or different from each other. Further, l and m are integers of 1 to 100, and a, b, c, and d are 0 or positive numbers and meet $0<(c+d)/(a+b+c+d)\leq 1.0$. Furthermore, each of X and Y represents a bivalent organic radial represented by the following general formula (2) or (3), (2)

wherein Z represents a bivalent organic radial selected from the following chemical formulae;

and n is 0 or 1. Further, each of $R^5$ and $R^6$ represents an alkyl group or an alkoxy group having one of carbon numbers 1 to 4, and these groups may or may not be different from each other. k is 0, 1, or 2, (3)

wherein V represents a bivalent organic group selected from the following chemical formulae;

and p is 0 or 1. Furthermore, each of $R^7$ and $R^8$ represents an alkyl group or an alkoxy group having one of carbon numbers 1 to 4, and these groups may or may not be different from each other. h is 0, 1, or 2.

[(A) Silicone Resin]

(A) The silicone resin having a repeating unit represented by general formula (1) gives an adhesive composition adhesion properties when pressure-bonded, film forming properties when forming an adhesive layer, and mechanical characteristics, and others, and has excellent insulation reliability.

In general formula (1), each of R1 to R4 represents a univalent hydrocarbon group having one of carbon numbers 1 to 8 or preferably represents a univalent hydrocarbon group having one of carbon numbers 1 to 6. Specifically, there are a linear, branched, or cyclic alkyl group such as a methyl group, an ethyl group, a propyl group, an isopropyl group, an n-butyl group, a tert-butyl group, a cyclohexyl group; a linear, branched, or cyclic alkenyl group such as a vinyl group, an allyl group, a propenyl group, a butenyl group, a hexenyl group, a cyclohexenyl group; an aryl group such as a phenyl group, a tolyl group; an aralkyl group such as a benzyl group, a phenylethyl group; and others.

Moreover, in general formula (1), l and m are integers from 1 to 100, or they are preferably integers from 1 to 80 in terms of compatibility of a later-described cross-linking agent and photo-acid-generating agent and light curing properties.

Additionally, a, b, c, and d in general formula (1) are 0 or positive numbers and meet $0<(c+d)/(a+b+c+d)\leq1.0$, or they preferably meet $0.1\leq(c+d)/(a+b+c+d)\leq0.5$ in the light of adhesion properties with respect to a substrate, electrical characteristics, and reliability, or they further preferably meet $0.15\leq(c+d)/(a+b+c+d)\leq0.25$. Further, it is preferable for c in general formula (1) to meet $0.05\leq c/(a+b+c+d)\leq0.3$ or particularly preferable for the same to meet $0.1\leq c/(a+b+c+d)\leq0.15$. In addition it is preferable for d in general formula (1) to meet $0.15\leq d/(a+b+c+d)\leq0.3$ or particularly preferable for the same to meet $0.2\leq d/(a+b+c+d)\leq0.25$. Furthermore, it is preferable for a and b in general formula (1) to meet $0.4\leq a/(a+b+c+d)\leq0.9$ and $0.4\leq b/(a+b+c+d)\leq0.9$.

Moreover, in general formula (1), X represents a bivalent organic group represented by general formula (2), and Y designates a bivalent organic group represented by general formula (3). Z or V in general formula (2) or (3) is a bivalent organic group selected from the following chemical formulae, and n or p is 0 or 1.

Each of $R^5$ and $R^6$ in general formula (2) represents an alkyl group or an alkoxy group having a carbon number from 1 to 4, these groups may be or may not be different from each other. As specific examples of $R^5$ and $R^6$, there are a methyl group, an ethyl group, an isopropyl group, a tert-butyl group, a methoxy group, an ethoxy group, an isopropyloxy group, and others.

Each of $R^7$ and $R^8$ in general formula (3) represents an alkyl group or an alkoxy group having a carbon number from 1 to 4, these groups may be or may not be different from each other. As specific examples of $R^7$ and $R^8$, there are groups equal to those of $R^5$ and $R^6$ in general formula (2).

Moreover, k or h in general formula (2) or (3) is 0, 1, or 2.

In the light of adhesion properties when pressure-bonded, film forming properties when forming an adhesive layer, mechanical characteristics, and others, it is preferable for (A) the silicone resin according to the present invention to have a weight average molecular weight of 3,000 to 500,000 or more preferable for the same to have a weight average molecular weight of 5,000 to 300,000. It is to be noted that the weight average molecular weight is a corresponding value of polystyrene based on gel permeation chromatography (GPO).

(A) The silicone resin according to the present invention can be manufactured by performing a so-called hydrosilylation polymerization reaction under a catalyst with respect to hydrogen siphenylene(1,4-bis(dimethylsilyl)benzene) in the following general formula (4),

(4)

and/or dihydroorganosiloxane of the following general formula (5),

(5)

where $R^1$ to $R^4$, l, and m are equal to those described above, a phenol compound having a diallyl group represented by the following general formula (6), (6)

where V, $R^7$, $R^8$, p, and h are equal to those described above, and a phenol compound having a diallyl group represented by the following general formula (7), (7)

where Z, $R^5$, $R^6$, n, and k are equal to those described above.

It is to be noted that a weight average molecular weight of (A) the silicone resin according to the present invention can be readily controlled by adjusting a ratio of a total number of allyl groups of phenol compounds represented by general formula (6) and general formula (7) and a total number of hydrosilyl groups of hydrogen silphenylene represented by general formula (4) and dihydroorganosiloxane represented by general formula (5) (a total number of allyl groups/a total number of hydrosilyl groups), which are to be subjected to the hydrosilylation polymerization reaction. Alternatively, the weight average molecular weight of (A) the silicone resin according to the present invention can be readily controlled by using, e.g., a monoallyl compound such as O-allyl phenol or monohydrosilane such as triethylhydrosilane or monohydrosiloxane as molecular weight modifiers at the time of hydrosilylation polymerization of phenol compounds having a diallyl group represented by general formula (6) and general formula (7), hydrogen silphenylene represented by general formula (4), and dihydroorganosiloxane represented by general formula (5).

As catalysts in the hydrosilylation polymerization, there are, e.g., a platinum group metal support such as platinum (including platinum black), rhodium, or palladium; a platinum chloride, a chloroplatinic acid, and a platinate chloride such as $H_2PtCl_4.xH_2O$, $H_2PtCl_6.xH_2O$, $NaHPtCl_6.xH_2O$, $KHPtCl_6.xH_2O$, $Na_2PtCl.xH_2O$, $K_2PtCl_4.xH_2O$, $PtCl_4.xH_2O$, $PtCl_2$, $Na_2HPtCl_4.xH_2O$ (in the expressions, as x, an integer from 0 to 6 is preferable, and 0 or 6 is particularly preferable); an alcohol-modified chloroplatinic acid (U.S. Pat. No. 3,220,972); a complex of a chloroplatinic acid and olefin (U.S. Pat. No. 3,159,601, U.S. Pat. No. 3,159,662, and U.S. Pat. No. 3,775,452); a material obtained by supporting a platinum group metal such as platinum black or palladium by a support such as alumina, silica, or carbon; a rhodium-olefin complex; chlorotris (triphenylphosphine) rhodium (so-called Wilkinson's catalyst); a complex of a platinum chloride, a chloroplatinic acid, or a platinate chloride and siloxane containing a vinyl group (cyclic siloxane containing a vinyl group in particular); and others. Its amount used is a catalytic amount, and it is generally preferable for the platinum group metal to be 0.001% by mass to 0.1% by mass is preferable with respect to a total mass of polymerization reactants in general formulas (4) to (7).

In the hydrosilylation polymerization, a solvent may be used as required. As the solvent, a hydrocarbon-based solvent such as toluene or xylene is preferable, for example.

As the hydrosilylation polymerization conditions, from the viewpoint that the catalyst is not deactivated and polymerization is completed in a short time, for example, a temperature of 40 to 150° C., especially a temperature of 60 to 120° C. is preferable as a polymerization temperature.

Further, although a polymerization time is dependent on types and amounts of polymerization reactants in general formulas (4) to (7), it is preferable for the polymerization time to fall within the range of approximately 0.5 to 100 hours, especially 0.5 to 30 hours to avoid intervention of moisture into a polymerization reaction system. As described above, after the hydrosilylation polymerization reaction, the (A) silicone resin according to the present invention can be obtained by removing the solvent if the solvent is used.

[(B) Thermosetting Resin]

(B) The thermosetting resin according to the present invention provides adhesion properties, connection reliability, and insulation reliability to the adhesive composition of the present invention. As (B) the thermosetting resin, there are, e.g., an epoxy resin, a phenol resin, a melamine resin, an urethane resin, a polyester resin, and others without being restricted to a specific type. Among others, since (A) the silicone resin contains an epoxy group or a phenolic hydroxy group, (B) the thermosetting resin having a functional group that can cause a cross-linking reaction with these reaction groups is preferable, and hence the epoxy resin or the phenol resin is particularly preferable from this viewpoint.

Further, since (A) the silicone resin contains the epoxy group, using an epoxy resin hardener or an epoxy resin hardening accelerator together is preferable.

As described above, if (B) the thermosetting resin is obtained from the epoxy resin, from the phenol resin, from the epoxy resin and the epoxy resin hardener, from the epoxy resin and the epoxy resin hardening accelerator, or from the epoxy resin, the epoxy resin hardener, and the epoxy resin hardening accelerator, (B) the thermosetting resin that also causes the cross-linking reaction with the epoxy group or the phenolic hydroxy group contained in (A) the silicone resin when the adhesive composition is hardened can be obtained, adhesion properties when pressure-bonded and connection reliability and insulation properties when hardened can be preferably further improved, and hardening can be preferably appropriately and uniformly advanced by also using the epoxy resin hardener.

As the epoxy resins that can be used as (B) the thermosetting resin according to the present invention, there are, e.g., a bisphenol A epoxy resin, a bisphenol F epoxy resin, a material obtained by hydrogenating these epoxy resins, a phenol novolac-type epoxy resin, a glycidyl ether-based epoxy resin such as a cresol novolac-type epoxy resin, hexahydro phthalate glycidyl ester, a glycidyl ester-based epoxy resin such as dimer acid glycidyl ester, triglycidyl isocyanurate, and a glycidyl amine-based epoxy resin such as tetraglycidyl diaminodiphenylmethane or, preferably, there are the bisphenol A epoxy resin, the bisphenol F epoxy resin, the phenol novolac-type epoxy resin, and the cresol novolac-type epoxy resin. As commercialized products of these materials, there are, e.g., jER1001 (manufactured by Mitsubishi Chemical Corporation), Epiclon 830S (manufactured by DIC), jER517 (manufactured by Mitsubishi Chemical Corporation), EOCN103S (manufactured by Nippon Kayaku Co., Ltd.), and others as trade names.

As phenol resins that can be used as (B) the thermosetting resin according to the present invention, there are, e.g., alkylphenol such as phenol, bisphenol A, p-t-butylphenol, octyl phenol, p-cumylphenol; p-phenylphenol; a resol-type phenol resin prepared by using, e.g., cresol as a raw material, and/or a novolac-type phenol resin.

Usually, the epoxy resin hardener that can be contained in (B) the thermosetting resin according to the present invention is not restricted in particular if it can be used as an epoxy resin hardener, but an aromatic-based hardener or an alicyclic hardener is preferable from the viewpoint of heat resistance. As this epoxy resin hardener, for example, there are a polyamine-based hardener, an acid anhydride-based hardener, a boron trifluoride amine complex, a phenol resin, and others. As the polyamine-based hardeners, for example, there are an aliphatic amine-based hardener such as diethylene triamine, tetraethylenetetramine, tetraethylenepentamine; an alicyclic amine-based hardener such as isophoronediamine; an aromatic amine-based hardener such as diaminodiphenylmethane, phenylenediamine, and dicyandiamide; and the like but the aromatic amine-based hardener is particularly preferable. As acid anhydride-based hardeners, for example, there are phthalic anhydride, pyromellitic anhydride, trimellitic anhydride, a hexahydro phthalic anhydride, and others. In regard to the epoxy resin hardeners, one type alone may be used, or two or more types can be used together.

As the epoxy resin hardening accelerators that can be contained in (B) the thermosetting resin according to the present invention, there are, for example, 2-methylimidazole, 2-ethylimidazole, 2-ethyl-4-methylimidazole, an ethylisocyanate compound of these compounds, imidazole compounds such as 2-phenylimidazole, 2-phenyl-4-methylimidazole, 2-phenyl-4-methyl-5-hydroxymethylimidazole, and 2-phenyl-4,5-dihydroxymethylimidazole, DBU-based compounds such as 1,8-diazabicyclo(5.4.0)undecene-7 (DBU), 1,5-diazabicyclo(4.3.0)nonene-5 (DBN), an organic acid salt of DBU, a phenol resin salt of DBU, and a tetraphenylborate salt of a DBU derivative, triorganophosphines such as triphenylphosphine, tributylphosphine, tris(p-methylphenyl)phosphine, tris(p-methoxyphenyl)phosphine, tris(p-ethoxyphenyl)phosphine, triphenylphosphine triphenylborate, and tetraphenylphosphine tetraphenylborate, tertiary amine such as a quaternary phosphonium salt and triethyleneammonium triphenylborate, and its tetraphenyl boron phosphate. In regard to the epoxy resin hardening accelerators, one type alone may be used, or two or more types may be used together.

Although a blending quantity of (B) the thermosetting resin according to the present invention is not restricted in particular, it is usually 5 to 400 parts by mass with respect to 100 parts by mass of (A) the silicone resin or, preferably, it is 10 to 360 parts by mass. When (B) the thermosetting resin falls within the range of 5 to 400 parts by mass, a resultant adhesive composition and an adhesive sheet having the adhesive composition as an adhesive layer have excellent adhesion properties when pressure-bonded and has excellent connection reliability and insulation reliability when hardened. One type of (B) the thermosetting resin along may be used, or two or more types of the same may be used together.

[(C) Compound Having Flux Activity]

(C) The compound having a flux activity according to the present invention is not restricted in particular as long as it has an effect of reducing and removing a metal oxide film by, e.g., heating (a flux activity), and there are, e.g., active rosin, an organic acid having a carboxyl group, amine, phenol, alcohol, amine, and others.

In particular, a compound having a carboxyl group or a phenolic hydroxy group in molecules is preferable as (C) the compound having a flux activity according to the present invention, and (C) the compound having a flux activity may be a liquid or a solid. When (C) the compound having a flux activity is the compound having a carboxyl group or a phenolic hydroxy group in molecules, an effect of removing a metal oxide film on bumps soldered on a functional surface of a semiconductor chip by, e.g., heating in soldering is high when soldering the functional surface of the semiconductor chip having the adhesive composition adhering thereto, which is preferable.

As (C) the compound with a flux activity having the carboxyl group, there are, e.g., aliphatic acid anhydride, alicyclic acid anhydride, an aromatic acid anhydride, an aliphatic calboxylic acid, an aromatic calboxylic acid, and others. Further, as (C) the compound with a flux activity having the phenolic hydroxy group, there are, e.g., phenols.

As the aliphatic acid anhydride, there are, e.g., succinic anhydride, polyadipic acid anhydride, polyazelaic polyanhydride, polysebacic polyanhydride, and others.

As the alicyclic acid anhydride, there are, e.g., methyltetrahydrophthalic anhydride, methylhexahydrophthalic anhydride, anhydrous methylhymic acid, hexahydrophthalic anhydride, tetrahydrophthalic anhydride, trialkyltetrahydrophthalic anhydride, methylcyclohexenedicarboxylic anhydride, and others.

As the aromatic acid anhydride, there are, e.g., phthalic anhydride, trimellitic anhydride, pyromellitic anhydride, benzophenonetetracarboxylic anhydride, ethyleneglycolbistrimellitate, glyceroltristrimellitate, and others.

As the aliphatic carboxylic acid, there are, e.g., a glutaric acid, an adipic acid, a pimelic acid, a sebacic acid, and others.

As other aliphatic carboxylic acids, there are a formic acid, an acetic acid, a propionic acid, a butyric acid, a valeric acid, a pivalic acid, a caproic acid, a caprylic acid, a lauric acid, a myristic acid, a palmitic acid, a stearic acid, an acrylic acid, a methacrylic acid, a crotonic acid, an oleic acid, a fumaric acid, a maleic acid, an oxalic acid, a malonic acid, a succinic acid, and others.

As the aromatic carboxylic acid, there are, e.g., a benzoic acid, a phthalic acid, an isophthalic acid, a terephthalic acid, a hemimellitic acid, a trimellitic acid, a trimesic acid, a mellophanic acid, a prehnitic acid, a pyromellitic acid, a mellitic acid, a triyl acid, a xylic acid, a hemellitic acid, a mesitylene acid, a prehnitylic acid, a toluic acid, a cinnamic acid, a salicylic acid, a 2,3-dihydroxybenzoic acid, a 2,4-dihydroxybenzoic acid, a gentisic acid (2,5-dihydroxybenzoic acid), a 2,6-dihydroxybenzoic acid, a 3,5-dihydroxybenzoic acid, a gallic acid (3,4,5-trihydroxybenzoic acid), a naphthoic derivative such as a 1,4-dihydroxy-2-naphthoic acid, a 3,5-dihydroxy-2-naphthoic acid; phenolphthalein; a diphenolic acid; and others.

As (C) the compound with a flux activity having the phenolic hydroxy group, there are, e.g., monomers containing phenolic hydroxy groups such as phenol, o-cresol, 2,6-xylenol, p-cresol, m-cresol, o-ethylphenol, 2,4-xylenol, 2,5-xylenol, m-ethylphenol, 2,3-xylenol, meditol, 3,5-xylenol, p-tertiarybutyl phenol, catechol, p-tertiaryamyl phenol, resorcinol, p-octyl phenol, p-phenyl phenol, bisphenol A, bisphenol F, bisphenol AF, biphenol, diallyl bisphenol F, diallyl bisphenol A, trisphenol and tetrakis phenol.

Further, (C) the compound having a flux activity according to the present invention is preferably a compound capable of being incorporated in a cross-linked structure in a three-dimensional manner by way of reaction with (A) the silicone resin or (B) the thermosetting resin, e.g., a crosslinkable resin such as an epoxy resin, and a preferable example of such a compound is a resin hardener having a flux activity. As a result, when the adhesive compound according to the present invention is used as an adhesive layer to flip-chip-mount a semiconductor chip with respect to a substrate, even if a residue of (C) the compound having a flux activity is produced, it can be prevented from being precipitated from a three-dimensional cross-linked structure of the resin, and growth of dendrites resulting from the residue can be suppressed, whereby insulation reliability (migration resisting properties) can be further improved. Moreover, the flux cleaning step after soldering can be omitted.

Although a content of (C) the compound having a flux activity according to the present invention is not restricted in particular, it is preferable for this content to be not lower than 1% by mass and not greater than 20% by mass of a total mass of (A) the silicone resin and (B) the thermosetting resin, and more preferable for the same to be not lower than 2% by mass and not greater than 15% by mass. An effect of the flux activity is sufficient when the content of (C) the compound having a flux activity is not lower than 1% by mass, and precipitation of (C) the compound having a flux activity after flip chip mounting step can be suppressed when the content is not greater than 20% by mass. Additionally, as described above, when (C) the compound having a flux activity is crosslinkable with a resin in the adhesive composition, since the unreacted compound having a flux activity can be prevented from remaining, migration caused due to the unreacted compound having a flux activity can be suppressed. Further, when the content of (C) the compound having a flux activity is not lower than 1% by mass and not greater than 20% by mass, an oxide film on a metal surface can be sufficiently removed, excellent joint with high strength can be obtained at the time of solder joint.

[Other Arbitrary Components]

Besides (A) the silicone resin, (B) the thermosetting resin, and (C) the compound having a flux activity, any other arbitrary components may be added as long as characteristics of the adhesive composition according to the present invention are not deteriorated. Examples of the other arbitrary components will now be described hereinafter.

Inorganic Filler

It is preferable for the adhesive composition according to the present invention to further contain an inorganic filler when characteristics such as heat resistance properties, dimension stability, moisture resistance properties, and others are demanded in particular. As such an inorganic filler, there are, e.g., silicates such as talc, calcined clay, uncalcined clay, mica and glass; oxides such as titanium oxide, alumina, and powders of fused silica (fused spherical silica, fused crushed silica) and crystalline silica; carbonates such as calcium carbonate, magnesium carbonate and hydrotalcite; hydroxides such as aluminum hydroxide, magnesium hydroxide and calcium hydroxide; sulfates or sulfites such as barium sulfate, calcium sulfate and
calcium sulfite; borates such as zinc borate, barium metaborate, aluminum borate, calcium borate and sodium borate; and nitrides such as aluminum nitride, boron nitride and silicon nitride. These inorganic fillers may be used in an independent manner, or in a combined form of two or more types of them. Among them, silica powders such as fused silica and crystalline silica are preferable, and spherical fused silica is particularly preferable.

By adding the inorganic filler to the adhesive composition according to the present invention, the adhesive composition after being cured may be improved in the heat resistance, moisture resistance, strength, and others. Further, it is possible to improve delamination properties of the adhesive layer constituted of the adhesive composition according to the present invention with respect to the protection layer. While the shape of the inorganic composition is not specifically limited, a sphere may be preferable, and it is possible to provide the adhesive material suitable as the adhesive layer, which exhibits no special anisotropy.

While an average particle diameter of the inorganic filler is not specifically limited, it may be preferably to 0.01 μm or above and 0.5 μm or smaller, and particularly preferably from 0.01 μm to 0.3 μm. The inorganic filler is hardly agglomerated and a reduction of strength can be suppressed if the average particle diameter is 0.01 μm or above, and it is possible to suppress a reduction of transparency of the adhesive layer made of the adhesive composition according to the present invention and a difficulty in recognizing alignment marks on the surface of the semiconductor chip if the average particle diameter is 0.5 μm or smaller, thereby facilitating positioning of the semiconductor chip and the substrate.

Although the content of the inorganic filler is not specifically limited, it is preferable to adjust the content to 5% by mass or above and 60% by mass or below of a total mass of the adhesive composition according to the present invention. If the content of the inorganic filler is equal to or below 60-weight % of the total mass of the adhesive composition, a reduction of transparency can be suppressed, and a reduction of tacky properties of the adhesive layer can be also suppressed, which is preferable.

Silane Coupling Agent

Further, the adhesive composition according to the present invention may further contain a silane coupling agent. By containing the silane coupling agent, the adhesive layer made of the adhesive composition according to the present invention may further be improved in the adhesiveness to the structure to be adhered. The silane coupling agent may be exemplified by an epoxy silane coupling agent, and an aromatic-group-containing amino silane coupling agent. These silane coupling agents may be used in an independent manner, or in a combined form of two or more types of them. Although content of the silane coupling agent is not specifically limited, it is preferably adjusted to 0.01% by mass to 5% by mass of the total mass of the adhesive composition according to the present invention. The adhesive composition according to the present invention may also contain components other than those described in the above. For example, various additives may appropriately be added, in view of improving various characteristics of the adhesive composition according to the present invention including compatibility with (A) the silicone resin and (B) the thermosetting resin, stability, and workability.

Organic Solvent

Although the other arbitrary components described above may be added to the adhesive composition according to the present invention without using a solvent, these components may be solved or dispersed in an organic solvent, prepared as a solution or a dispersion liquid (which will be simply referred to as a "solution" hereinafter), and then added. As this organic solvent, there are, e.g., N,N-dimethylacetamide, methyl ethyl ketone, N,N-dimethylformamide, cyclohexanone, cyclopentanone, N-methyl-2-pyrolidone, toluene, methanol, ethanol, isopropanol, acetone, propylene glycol monomethyl ether, propylene glycol monomethyl ether acetate, and others, and there are preferably methyl ethyl ketone, cyclopentanone, propylene glycol monomethyl ether, and propylene glycol monomethyl ether acetate. These organic solvents may be used in an independent manner, or in a combined form of two or more types of them.

[Adhesive Sheet]

The present invention provides the adhesive sheet having the adhesive layer made of the adhesive composition. The adhesive sheet is exemplified by an adhesive sheet, which has the adhesive layer made of the adhesive composition according to the present invention and a protective layer that covers the adhesive layer. As the protective layer, one described below can be used. An example of a method for manufacturing an adhesive sheet according to the present invention will now be described hereinafter.

An adhesive composition solution is manufactured in advance by mixing and adjusting (A) the silicone resin, (B) the thermosetting resin, and (C) the compound having a flux activity, any other arbitrary components, and an organic solvent in a liquid form, and the adhesive composition solution is applied to the protective layer by using, e.g., a reverse roll coater or a comma coater. The protective layer having the adhesive composition solution applied thereto is dried by removing the organic solvent at 80 to 160° C. for 2 to 20 minutes with use of an in-line driver and then pressure-bonded to and laminated on another protective layer by using a roll laminator, thereby obtaining the adhesive sheet.

Protective Layer (Demoldable Base Material)

Although the protective layer is not restricted in particular as long as it is demoldable without deteriorating the form of the adhesive layer made of the adhesive composition according to the present invention, it is usually exemplified by plastic films such as a polyethylene (PE) film, a polypropylene (PP) film, a polymethylpentene (TPX) film, or a demolded polyester film.

[Use of Adhesive Sheet]

The adhesive sheet according to the present invention can be used for, e.g., flip chip mounting for directly connecting bumps provided on a semiconductor chip to a substrate electrode, and it can be also used for an application of connecting semiconductor devices having through electrodes to each other.

Figure 2:
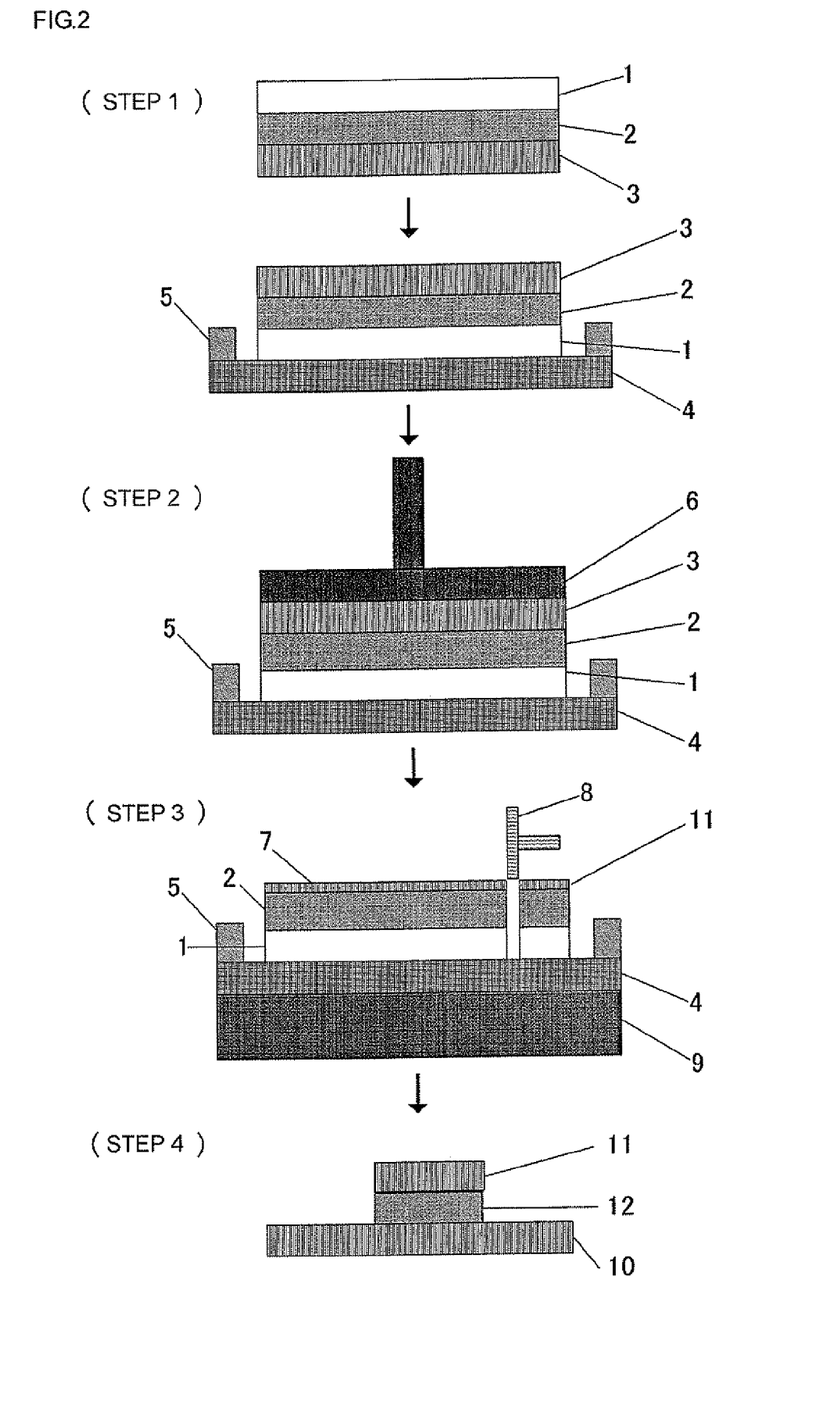
FIG. 2 is a flow diagram showing steps from a semiconductor chip manufacturing step using the adhesive sheet having the adhesive layer made of the adhesive composition according to the present invention and before a flip chip mounting step.

FIG. 1(I) and FIG. 2 show an example of usage of the adhesive sheet according to the present invention, and this usage will be explained hereinafter. First, fabrication of a semiconductor chip having the adhesive sheet according to the present invention bonded thereto will be explained with reference to FIG. 2. The adhesive sheet (1, 2) according to the present invention constituted of a protective layer 1 and an adhesive layer 2 is first attached to a functional surface of a semiconductor wafer 3 having bumps (not shown) formed thereon in advance by, e.g., heating pressure bonding. A semiconductor processing protective tape 4 is attached to the protective layer 1 side of the adhesive sheet (1, 2) attached to the semiconductor wafer 3, and this is supported by a wafer ring 5. Subsequently, the semiconductor processing protective tape 4 is fixed to a grinding (polishing) stage (not shown) (a step 1). Here, the semiconductor processing protective tape 4 is generally commercially available under the name of a back-grinding tape, a dicing tape, and the like, and tapes for various purposes can be used. Although not shown, the semiconductor processing protective tape 4 can directly come into contact with the adhesive layer 2.

Then, the semiconductor wafer 3 with the adhesive sheet (1, 2) attached thereto is ground (polished) by a grind wheel 6 (a step 2). A grinding (polishing) apparatus having the grind wheel 6 is not restricted in particular, and a commercially available grinding apparatus can be used. Here, a thickness of the back-ground semiconductor wafer 3 is not restricted, but realizing a thickness of approximately 30 to 600 μm is preferable.

Then, the back-ground (polished) semiconductor wafer 7 is installed in such a manner that the semiconductor processing protective tape 4 can come into contact with a dicer table 9, and the semiconductor wafer 7 with the adhesive sheet (1, 2) attached thereto is diced together with the adhesive sheet (1, 2) into respective pieces by a dicing blade 8 of the dicer to provide a semiconductor chip 11 having the diced adhesive sheet attached thereto (a step 3).

Then, the semiconductor processing protective tape 4 is expanded by an expanding apparatus, and the diced semiconductor chips 11 each having the adhesive sheet are separated from each other at fixed intervals, then each semiconductor chip 11 is picked up, and the protective layer is removed from the adhesive layer, thereby obtaining the semiconductor chip 11 having each diced adhesive layer 12 attached thereto. The semiconductor chip 11 is mounted on a base substrate 10 in such a manner that a surface of the diced adhesive layer 12 bonded to the protective layer can adhere to the base substrate 10 (a step 4).

As described above, the adhesive sheet according to the present invention can be used from the fabrication steps of the semiconductor chip. A subsequent flip chip mounting process will now be described.

FIG. 1(I) shows the flip chip mounting process using the adhesive sheet according to the present invention. The semiconductor chip 11 having the diced adhesive layer 12 exposed by delaminating the protective layer from the adhesive layer is positioned and mounted on the base substrate 10 (a step 4). Then, bumps 11a on the functional surface of the semiconductor chip 11 are joined and connected to electrodes 13 on the base substrate 10 by solder joint to provide jointed portions 14, and (B) the thermosetting resin or the like contained in the adhesive layer 12 is hardened to provide a hardened adhesive layer 12a, thereby sealing a gap between the semiconductor chip 11 and the base substrate 10 with the resin (a step 5).

As a result, the bump 11a on the functional surface of the semiconductor chip 11 can be joined and connected to the electrodes 13 on the base substrate 10 and the gap between the semiconductor chip 11 and the base substrate 10 can be sealed with the resin without carrying out a step of, e.g., applying a flux 21 to a circuit substrate 20 (a step (a)), a flux cleaning step (a step (d)), a step of applying a liquid sealing resin composition (underfill 24) to one side or a plurality of sides of a semiconductor chip 22 (a step (e)), and a step of flowing the liquid sealing resin composition (the underfill 24) into a gap between the circuit substrate 20 and the semiconductor chip 22 by utilizing the capillary phenomenon (a step (f)) in a capillary underfill method (FIG. 1(II)).

Moreover, according to the adhesive sheet having the adhesive layer made of the adhesive composition of the present invention, there can be obtained the adhesive sheet that has excellent adhesion properties when pressure-bonded (the steps 1 and 4) and provides a resin hardened material superior in connection reliability and insulation reliability when hardened (the step 5).

[Semiconductor Apparatus Protection Material]

Additionally, the adhesive sheet according to the present invention can be contained in a semiconductor apparatus protection material.

The semiconductor apparatus protection material according to the present invention is useful as not only the semiconductor apparatus protection material having the semiconductor processing protective tape 4 and the adhesive sheet (1, 2) attached to each other like, e.g., the step 1 in FIG. 2 but also a top coat for electronic components such as a diode, a transistor, an IC, or an LSI. Specifically, for example, the semiconductor apparatus protection material can be utilized in the wide range including: a junction coat film, a passivation film, and a buffer coat film for a surface of a semiconductor device such as a diode, a transistor, an IC, or an LSI; an alpha ray shielding film for an LSI and others; an interlayer insulator film for multilayer wiring; a conformal coat for a printed circuit board; an ion implantation mask; a top coat for a surface of a solar battery; and others.

[Semiconductor Apparatus]

Further, the semiconductor apparatus protection material according to the present invention can be used for manufacture of a semiconductor apparatus protected by the semiconductor apparatus protection material.

A method for manufacturing a semiconductor apparatus according to the present invention will now be described. The semiconductor apparatus protection material including the adhesive sheet according to the present invention is bonded to a semiconductor apparatus (an object to be bonded), and then a resin hardened material superior in connection reliability and insulation reliability is provided by hardening the semiconductor apparatus protection material, whereby the semiconductor apparatus protected by the semiconductor apparatus protection material can be manufactured.

Although the semiconductor apparatus (the object to be bonded) protected by the semiconductor apparatus protection material according to the present invention is not restricted in particular, it can be used in the wide range including not only a flip-chip-mounted semiconductor chip and a substrate but also electronic components such as a diode, a transistor, an IC, or an LSI, which are specifically: a surface of a semiconductor device such as a diode, a transistor, an IC, or an LSI; multilayer wiring; a printed circuit board; a liquid crystal display device; an ion implanted surface for which an ion implantation mask is used; a surface of a solar battery; and others.

EXAMPLES

The present invention will now be described hereinafter in detail based on synthesis examples of (A) the silicone resin according to the present invention and examples and comparative examples of the adhesive sheet according to the present invention, but the present invention is not restricted thereto. Chemical structural formulas of compounds (M-1) to (M-6) used in Synthesis Examples 1 to 3 of (A) the silicone resin according to the present invention are shown below.

Synthesis Example 1

Synthesis Example 1 of (A) the silicone resin according to the present invention will now be described. 220.5 g of the compound (M-1) and 225.0 g of the compound (M-3) were dissolved in 1,875 g of toluene in a 5-L flask including an agitator, a temperature gauge, a nitrogen substitution device, and a reflux condenser, and then 949.6 g of the compound (M-4) and the 6.1 g of the compound (M-5) were added and heated to 60° C. Subsequently, 2.2 g of a carbon support platinum catalyst (5% by mass) was put, rise of an internal reaction temperature to 65° C. to 67° C. was confirmed, heating was performed until the temperature reaches 90° C., this material was maintained for three hours, cooling was effected until the temperature again reaches 60° C., 2.2 g of the carbon support platinum catalyst (5% by mass) was further put, and 107.3 g of the compound (M-6) was dropped into the flask over one hour. At this time, a temperature in the flask was increased to 80° C. After the end of dropping the compound (M-6), the material was maintained at 90° C. for three hours and then cooled to a room temperature, 1,700 g of methyl isobutyl ketone (MIBK) was added, and this reaction solution was subjected to pressure filtration using a filter to remove the carbon support platinum catalyst, thereby obtaining a silicone resin solution. Furthermore, 760 g of pure water was added to the obtained silicone resin solution, and agitation, still standing, and liquid separation were carried out to remove a lower water layer. This liquid separation and water washing operation was repeated for six times to remove a small amount of an acid component in the silicone resin solution. Thereafter, the solvent in the silicone resin solution was removed while reducing a pressure, and 950 g of cyclopentanone was added to obtain a silicone resin solution (A-1) containing cyclopentanone and having solid content concentration of 60% by mass as a main solvent. When a molecular weight of (A) the silicone resin in this silicone resin solution was measured by GPC, a weight average molecular weight was 75,000 in conversion into polystyrene, and $(c+d)/(a+b+c+d)=0.50$ is achieved.

Synthesis Example 2

Synthesis Example 2 of (A) the silicone resin according to the present invention will now be described. 352.8 g of the compound (M-1) and 116.1 g of the compound (M-2) were dissolved in 1,875 g of toluene in a 5-L flask including an agitator, a temperature gauge, a nitrogen substitution device, and a reflux condenser, and then 949.6 g of the compound (M-4) and the 6.1 g of the compound (M-5) were added and heated to 60° C. Subsequently, 2.2 g of a carbon support platinum catalyst (5% by mass) was put, rise of an internal reaction temperature to 65° C. to 67° C. was confirmed, heating was performed until the temperature reaches 90° C., this material was maintained for three hours, cooling was effected until the temperature again reaches 60° C., 2.2 g of the carbon support platinum catalyst (5% by mass) was further put, and 107.3 g of the compound (M-6) was dropped into the flask over one hour. At this time, a temperature in the flask was increased to 73° C. After the end of dropping, the material was maintained at 90° C. for three hours and then cooled to a room temperature, 1,700 g of methyl isobutyl ketone (MIB) was added, and this reaction solution was subjected to pressure filtration using a filter to remove the carbon support platinum catalyst, thereby obtaining a silicone resin solution. Furthermore, 760 g of pure water was added to the obtained silicone resin solution, and agitation, still standing, and liquid separation were carried out to remove a lower water layer. This liquid separation and water washing operation was repeated for six times to remove a small amount of an acid component in the silicone resin solution. Thereafter, the solvent in the silicone resin solution was removed while reducing a pressure, and 940 g of cyclopentanone was added to obtain a silicone resin solution (A-2) containing cyclopentanone and having solid content concentration of 60% by mass as a main solvent. When a molecular weight of (A) the silicone resin in this silicone resin solution was measured by GPC, a weight average molecular weight was 55,000 in conversion into polystyrene, and $(c+d)/(a+b+c+d)=0.20$ is achieved.

Synthesis Example 3

Synthesis Example 3 of (A) the silicone resin according to the present invention will now be described. 396.9 g of the compound (M-1) and 45.0 g of the compound (M-3) were dissolved in 1,875 g of toluene in a 5-L flask including an agitator, a temperature gauge, a nitrogen substitution device, and a reflux condenser, and then 949.6 g of the compound (M-4) and the 6.1 g of the compound (M-5) were added and heated to 60° C. Subsequently, 2.2 g of a carbon support platinum catalyst (5% by mass) was put, rise of an internal reaction temperature to 65° C. to 67° C. was confirmed, heating was performed until the temperature reaches 90° C., this material was maintained for three hours, cooling was effected until the temperature again reaches 60° C., 2.2 g of the carbon support platinum catalyst (5% by mass) was further put, and 107.3 g of the compound (M-6) was dropped into the flask over one hour. At this time, a temperature in the flask was increased to 78° C. After the end of dropping, the material was maintained at 90° C. for three hours and then cooled to a room temperature, 1,700 g of methyl isobutyl ketone (MIBK) was added, and this reaction solution was subjected to pressure filtration using a filter to remove the carbon support platinum catalyst, thereby obtaining a silicone resin solution. Furthermore, 760 g of pure water was added to the obtained silicone resin solution, and agitation, still standing, and liquid separation were carried out to remove a lower water layer. This liquid separation and water washing operation was repeated for six times to remove a small amount of an acid component in the silicone resin solution. The solvent in the silicone resin solution was removed while reducing a pressure, and 950 g of cyclopentanone was added to obtain a silicone resin solution (A-3) containing cyclopentanone and having solid content concentration of 60% by mass as a main solvent. When a molecular weight of (A) the silicone resin in this silicone resin solution was measured by GPC, a weight average molecular weight was 62,000 in conversion into polystyrene, and $(c+d)/(a+b+c+d)=0.10$ is achieved.

The solutions of the (A) silicone resin synthesized in Synthesis Examples 1 to 3 were used to compound (B) the thermosetting resin, (C) the compound having a flux activity, and any other arbitrary components and solvents in the composition shown in Table 1, and then agitation, mixing, dissolution were carried out to obtain adhesive compositions, thereby acquiring adhesive sheets (Examples 1 to 7) each having an adhesive layer made of each of the adhesive compositions.

Examples 1 to 7 will now be described hereinafter in detail. In fabrication of the adhesive sheets of Examples 1 to 7, (B) the thermosetting resin, (C) the compound having a flux activity, and any other arbitrary components used in fabrication of the adhesive composition are specifically as follows.

<Components of Adhesive Composition>
(B) Thermosetting Resin (1) EOCN-103S (a trade name) (manufactured by Nippon Kayaku Co., Ltd., an epoxy equivalent amount: 209 to 219)

(2) jER1001 (a trade name) (manufactured by Mitsubishi Chemical Corporation, an epoxy equivalent amount: 450 to 500)

(3) NC6000 (a trade name) (manufactured by Nippon Kayaku Co., Ltd., an epoxy equivalent amount: 192 to 202)

(4) PHENOLITE TD-2093 (a trade name) (manufactured by DIC, an OH equivalent amount: 104)

(5) RIKACID HH (a trade name) (manufactured by New Japan Chemical Co., Ltd., hexahydro phthalic anhydride)

(6) CUREZOL 2P4 MHZ (a trade name) (manufactured by Shikoku Chemicals Corporation, 2-phenyl-4-methyl-5-hydroxymethylimidazole)

Here, each of the epoxy equivalent amount and the OH equivalent amount means an equivalent amount of an epoxy group or an OH group per molecule of each thermosetting resin.

(C) Compound Having Flux Activity
   (1) phenolphthalein
   (2) a sebacic acid
   Other Arbitrary Compounds
   Inorganic filler: silica (manufactured by Admatechs Co., Ltd., SE1050, an average particle diameter: 0.25 μm)
   Coupling agent: KBM-303 (manufactured by Shin-Etsu Chemical Co., Ltd., β-(3,4-epoxycyclohexyl)ethyltrimethoxysilane)
   Acrylic rubber: SG-708-6 (manufactured by Nagase ChemteX Corporation, butyl acrylate-ethyl acrylate-acrylic nitrile-acrylic acid-2-hydroxyethyl copolymer, a weight average molecular weight: 700,000)

<Method for Fabricating Adhesive Composition>

Respective components contained in the adhesive composition are mixed at a rate shown in Table 1 to obtain the adhesive composition. A unit of numerical values indicating compounding ratios in Table 1 is "parts by mass". Further, at the stage of generating the adhesive composition, (B) the thermosetting resin is not contained in Comparative Example 1, (C) the compound having a flux activity is not contained in Comparative Example 2, and (A) the silicone resin is not contained in Comparative Example 3.

<Method for Fabricating Adhesive Sheet>

Cyclopentanone was added to the obtained mixture of the adhesive composition to prepare a dispersion liquid of the adhesive composition having solid component concentration of 50% by mass. Subsequently, this liquid was applied to a surface of a polyester film (a protective layer) subjected to mold release processing by an applicator so that a thickness of the dispersion liquid of the adhesive composition can be 25 μm after drying, thereby obtaining an adhesive layer. Furthermore, this layer was dried in a blast oven at 130° C. for 5 minutes, and the adhesive composition was thereby dried to create adhesive sheets, thereby obtaining the adhesive sheets of Examples 1 to 7 and Comparative Examples 1 to 3. Characteristics of the adhesive sheets were evaluated based on an evaluation method 1, an evaluation method 2, and an evaluation method 3 described below. Table 1 also shows results of the evaluation.

[Evaluation Method 1: Adhesive Strength]

The adhesive sheet was attached to an 6-inch semiconductor wafer (a thickness: 625 μm) by using a vacuum film laminator (a temperature: 110° C., a pressure: 80 Pa). Then, a dicing tape (manufactured by Denki Kagaku Kogyo Kabushiki Kaisha) was attached to a surface of the adhesive sheet on the protective layer side while using a wafer ring as a support, and a semiconductor wafer having the adhesive sheet attached thereto was diced into a 2-mm-square size by a dicing blade of a dicer to obtain a semiconductor chip. At this time, the number of revolutions of a spindle was 30,000 rpm, and a cutting rate was 50 mm/sec. This 2-mm-square semiconductor chip was attached to a silicon wafer (a base substrate) cut into a square 15 mm on a side at 150° C. with a load of 50 mN, and then this material was heated at 180° C. for one hour to harden the thermosetting resin, thus obtaining an adhesive strength measurement test piece.

Figure 3:
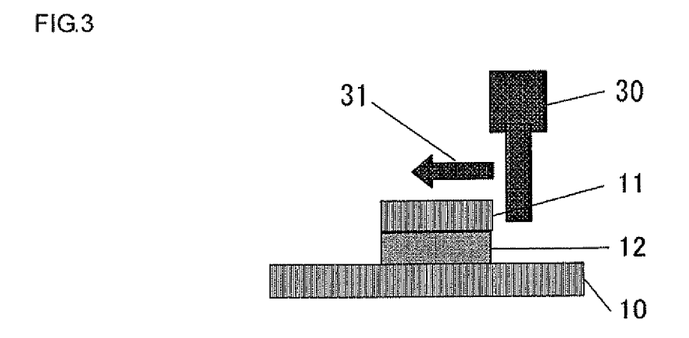
FIG. 3 is a view showing implementation of an adhesive strength measuring test of a semiconductor chip for a substrate.

FIG. 3 is a view showing implementation of an adhesive strength measurement test. A bond tester (Dage series 4000-PXY: manufactured by Dage) was used to evaluate adhesive strength of the adhesive layer 12 to which this test piece is bonded with resistance force applied when the 2-mm-square semiconductor chip 11 is delaminated from the base substrate 10 (a 15-cm-square silicon wafer). As test conditions, a test speed was 200 μm/sec and a test height was 50 μm. A moving direction 31 of a measurement jig 30 of the bond tester is indicated by an arrow in FIG. 3. An obtained numerical value is an average value of five-point measurement, and a higher numeral value represents higher adhesive strength of the adhesive sheet.

[Evaluation Method 2: Connection Reliability]

An adhesive sheet having a thickness of 50 μm was fabricated, and the adhesive sheet was attached to a surface of an 8-inch semiconductor wafer (a thickness: 725 μm) having bumps by using a vacuum film laminator (a temperature: 110° C., a pressure: 80 Pa). Then, a backgrinding tape (manufactured by Denki Kagaku Kogyo Kabushiki Kaisha) was attached to a surface of the adhesive sheet on a protective layer side while using a wafer ring as a support, and the semiconductor wafer was ground (polished) by a grinding (polishing) apparatus until a semiconductor wafer thickness becomes 100 μm.

Subsequently, this semiconductor wafer was diced into a 10-mm-square semiconductor chip (80 μmφ, Sn-3Ag-0.5 Cu bumps, a bump height: 50 μm, a pitch: 150 μm, the number of bumps: 3,844) by a dicing blade of the dicer. At this time, the number of revolutions of a spindle was 40,000 rpm, and a cutting rate was 30 mm/sec.

Then, the semiconductor chip having the adhesive sheet attached thereto was positioned with respect to a bismaleimide-triazine (BT) resin substrate (a thickness: 0.94 mm) coated with a solder resist (Taiyo Ink Mfg. Co., Ltd., PSR4000, AUS703) by using a flip chip bonder and then pressure-bonded by heat at 255° C. for 15 seconds to obtain a flip chip package. Thereafter, this package was heated at 180° C. for one hour to effect post-cure of the adhesive sheet.

Connection resistance of the thus obtained flip chip package was measured, and initial electrical conduction was confirmed. Furthermore, whether electrical conduction is achieved after a heat cycle test (maintenance at −25° C. for 10 minutes and maintenance at 125° C. for 10 minutes are repeated for 1000 cycles) was confirmed, connection reliability was evaluated with a circle mark representing that electrical conduction was achieved before and after the heat cycle test, a triangle mark representing that electrical conduction was achieved on the initial stage but no electrical conduction was achieved after the heat cycle test, and a cross mark representing that no electrical conduction was achieved on the initial stage, and results with the circle marks were determined to be acceptable.

[Evaluation Method 3: Insulation Reliability=Migration Resisting Properties]

A comb-like circuit having a Cu thickness of 5 μm and a line width/a space width=20 μm/20 μm was fabricated on a glass substrate, and an adhesive sheet was attached so as to cover the comb-like circuit by a vacuum film laminator (a temperature: 110° C., a pressure: 80 Pa) (a terminal portion was masked by using a masking tape). Then, a protective layer of the adhesive sheet was delaminated, the adhesive sheet was hardened by performing heating at 180° C. for one hour, thereby fabricating an insulation reliability evaluation sample. A direct-current voltage of 10 V was applied to two poles of the circuit of this test piece under conditions of a temperature of 85° C. and relative humidity of 85%, and a migration tester (manufactured by IMV Corporation, MIG-86) was used to evaluate insulation reliability. A situation that short-circuit (a reduction of a resistance value) occurred between conductors within 1,000 hours after the voltage application or a situation where growth of dendrite was confirmed after elapse of 1,000 hours was evaluated as "no good" and represented by a cross mark, and a situation that a resistance value was maintained even after elapse of 1,000 hours and no dendrite was produced was evaluated as "good" and represented by a circle mark.

TABLE 1

| | COMPONENT | EXAMPLE 1 | 2 | 3 | 4 | 5 | 6 | 7 | COMPARATIVE EXAMPLE 1 | 2 | 3 |
|---|---|---|---|---|---|---|---|---|---|---|---|
| A SILICONE RESIN | SYNTHESIS EXAMPLE1 (A-1) | 100 | 100 | 100 | 100 | | | 100 | 100 | 100 | |
| | SYNTHESIS EXAMPLE2 (A-2) | | | | | 100 | | | | | |
| | SYNTHESIS EXAMPLE3 (A-3) | | | | | | 100 | | | | |
| B THERMOSETTING RESIN | EOCN-103S | 20 | 10 | 10 | 20 | 20 | 20 | 250 | | 20 | |
| | jER-1001 | | 10 | 10 | | | | | | | |
| | NC6000 | | | | | | | | | | 161 |
| | PHENOLITE TD-2093 | | 5 | | | | | 150 | | | 35 |
| | RIKACID HH | | | 5 | | | | | | | |
| | CUREZOL 2P4MHZ | 1 | 1 | 1 | 1 | 1 | 1 | 5 | | 1 | 0.3 |
| C FLUX ACTIVATED MATERIAL | PHENOLPHTHALEIN | 6 | 6 | 6 | 6 | 6 | 6 | | 5 | | 44 |
| | SEBACIC ACID | | | | | | | 25 | | | |
| OTHERS | INORGANIC FILLER SE1050 | | | | 40 | | | | | | |
| | COUPLING AGENT KBM-303 | | 1 | 1 | | | | | | | 1.8 |
| | ACRYLIC RUBBER SG-708-6 | | | | | | | | | | 100 |
| ADHESIVE STRENGTH [MPa] | | 21.5 | 23.0 | 22.2 | 21.3 | 22.5 | 24.0 | 28.0 | 18.7 | 21.0 | 23.0 |
| CONNECTION RELIABILITY | | ○ | ○ | ○ | ○ | ○ | ○ | ○ | X | X | ○ |
| INSULATION RELIABILITY | | ○ | ○ | ○ | ○ | ○ | ○ | ○ | ○ | ○ | X |

It was obvious from the evaluation methods 1 to 3 and Table 1 that Comparative Example 1 that does not contain (B) the thermosetting resin has poor adhesive strength and no connection reliability. Moreover, it was also clear that Comparative Example 2 that does not contain (C) the compound having a flux activity has low adhesive strength and no connection reliability. Additionally, it was revealed that Comparative Example 3 that does not contain (A) the silicone resin has no insulation reliability. On the other hand, it was confirmed from results of the evaluation methods 1 to 3 using the adhesive sheet (Examples 1 to 7) having the adhesive layer made of the adhesive composition according to the present invention that the semiconductor apparatus adhesive sheet that has excellent adhesive strength when pressure-bonded and has excellent connection reliability and insulation reliability when hardened can be obtained. Further, the semiconductor apparatus protection material including the adhesive sheet having the adhesive layer made of such an adhesive composition according to the present invention likewise has excellent adhesive strength when pressure-bonded and has excellent connection reliability and insulation reliability when hardened, and the semiconductor apparatus protected by the semiconductor apparatus protection material can be a semiconductor apparatus, which is strongly bonded and protected by the semiconductor apparatus protection material and has guaranteed connection reliability and insulation reliability.

Therefore, the hardened material obtained by hardening the adhesive composition according to the present invention and the adhesive sheet using this composition has excellent adhesion properties and also has excellent connection reliability and insulation reliability (migration resisting property), and hence applications to further density growth and high integration of the semiconductor apparatus can be expected.

It is to be noted that the present invention is not restricted to the foregoing embodiment. The foregoing embodiment is just an example, and any examples that have substantially the same configuration and exhibit the same functions and effects as the technical concept described in claims according to the present invention are included in the technical scope of the present invention.

What is claimed is:
1. An adhesive composition comprising at least:
   (A) a silicone resin constituted of a repeating unit represented by the following general formula (1);
   (B) a thermosetting resin; and
   (C) a compound having a flux activity, wherein:
   $R^1$ to $R^4$ represent univalent hydrocarbon groups having carbon numbers from 1 to 8, which are equal to or different from each other;
   each of l and m is an integer from 1 to 100; each of a, b, and d is 0 or a positive number and c is a positive number and meets $0<(c+d)/(a+b+c+d) \leq 1.0$; and each of X and Y is a bivalent organic group represented by the following general formula (2) or (3), (2)

wherein:
Z is a bivalent organic group selected from the following formulae:

n is 0 or 1;
$R^5$ and $R^6$ represent an alkyl group or an alkoxy group having a carbon number from 1 to 4 and they are different from each other or equal to each other; and
k is 0, 1, or 2, (3)

wherein:
V is a bivalent organic group selected from the following formulae:

p is 0 or 1;
$R^7$ and $R^8$ represent an alkyl group or an alkoxy group having a carbon number from 1 to 4 and they are different from each other or equal to each other; and
h is 0, 1, or 2.

2. The adhesive composition according to claim 1, wherein (B) the thermosetting resin is made of an epoxy resin or made of an epoxy resin and an epoxy resin hardener.

3. The adhesive composition according to claim 1, wherein (C) the compound having a flux activity is a compound having a carboxy group or a phenolic hydroxy group.

4. The adhesive composition according to claim 2, wherein (C) the compound having a flux activity is a compound having a carboxy group or a phenolic hydroxy group.

5. An adhesive sheet comprising an adhesive layer made of the adhesive composition according to claim 1.

6. An adhesive sheet comprising an adhesive layer made of the adhesive composition according to claim 2.

7. An adhesive sheet comprising an adhesive layer made of the adhesive composition according to claim 3.

8. An adhesive sheet comprising an adhesive layer made of the adhesive composition according to claim 4.

9. A semiconductor apparatus protection material comprising the adhesive sheet according to claim 5.

10. A semiconductor apparatus protection material comprising the adhesive sheet according to claim 6.

11. A semiconductor apparatus protection material comprising the adhesive sheet according to claim 7.

12. A semiconductor apparatus protection material comprising the adhesive sheet according to claim 8.

13. A semiconductor apparatus protected by the semiconductor apparatus protection material according to claim 9.

14. A semiconductor apparatus protected by the semiconductor apparatus protection material according to claim 10.

15. A semiconductor apparatus protected by the semiconductor apparatus protection material according to claim 11.

16. A semiconductor apparatus protected by the semiconductor apparatus protection material according to claim 12.

* * * * *